(12) United States Patent
Ahmadi

(10) Patent No.: US 11,005,688 B2
(45) Date of Patent: May 11, 2021

(54) COMMON-MODE CONTROL FOR AC-COUPLED RECEIVERS

(71) Applicant: Analog Bits Inc., Sunnyvale, CA (US)

(72) Inventor: Mohammad Mahdi Ahmadi, Tehran (IR)

(73) Assignee: Analog Bits Inc., Sunnyvale, CA (US)

( * ) Notice: Subject to any disclaimer, the term of this patent is extended or adjusted under 35 U.S.C. 154(b) by 0 days.

(21) Appl. No.: 16/546,991

(22) Filed: Aug. 21, 2019

(65) Prior Publication Data
US 2021/0058276 A1 Feb. 25, 2021

(51) Int. Cl.
| | |
|---|---|
| *H04L 25/02* | (2006.01) |
| *H04L 25/08* | (2006.01) |
| *H03F 3/45* | (2006.01) |
| *H03K 19/0185* | (2006.01) |

(52) U.S. Cl.
CPC ..... *H04L 25/0276* (2013.01); *H03F 3/45076* (2013.01); *H03K 19/018564* (2013.01); *H04L 25/085* (2013.01)

(58) Field of Classification Search
CPC .......... H04L 25/0276; H04L 25/03019; H04L 25/085; H04L 25/03875; H04L 25/03885; H04B 3/00; H04B 3/02; H03F 3/45663; H03F 3/45672; H03F 3/45681; H03F 3/4569; H03F 3/45; H03F 3/45071; H03F 3/45076
See application file for complete search history.

(56) References Cited

U.S. PATENT DOCUMENTS

| | | |
|---|---|---|
| 5,180,990 A | 1/1993 | Ohkuma |
| 6,731,683 B1 | 5/2004 | Fiedler et al. |
| 6,819,166 B1 | 11/2004 | Choi et al. |
| 7,560,969 B2 * | 7/2009 | Chu .................... H03F 3/45475 327/307 |
| 9,647,618 B1 * | 5/2017 | Yuan ................... H03F 3/45708 |

OTHER PUBLICATIONS

PCT International Search Report and Written Opinion in International Appln. No. PCT/US2020/047476, dated Sep. 24, 2020, 6 pages.

* cited by examiner

*Primary Examiner* — Betsy Deppe
(74) *Attorney, Agent, or Firm* — Fish & Richardson P.C.

(57) ABSTRACT

Implementations provide a receiver circuit that includes: an alternate current (AC)-coupling network to filter an input signal, the AC-coupling network including a first RC filter connected between a first input node and a first common node and a second RC filter connected between a second input node and the first common node; a differential amplifier coupled to the AC-coupling network and configured to receive a filtered input signal from the AC-coupling network and generate an output signal, the differential amplifier including a differential pair of transistors and a common-mode measurement network coupled to source terminals of a first and a second transistors in the differential pair; and a first operational amplifier having an input coupled to output terminal of the common-mode measurement network and an output coupled to the first common node.

20 Claims, 6 Drawing Sheets

COMMON-MODE CONTROL FOR AC-COUPLED RECEIVERS

TECHNICAL FIELD

The disclosure generally relates to high-speed wireline link receiver and in particular to common-mode control methods.

BACKGROUND

High-speed wireline link receiver is widely used in broadband communication system that power the Internet and big data infrastructure.

SUMMARY

In one aspect, some implementations provide a receiver circuit that includes: an alternate current (AC)-coupling network coupled to two input nodes, the AC-coupling network configured to filter an input signal and including: a resistor-capacitor (RC) network coupled to the two input nodes, the RC network including: a first arm connecting a first input node to a first common node, the first arm comprising a first capacitor characterized by a first capacitance and a first resistor characterized by a first resistance, the first capacitor and the first resistor connected in series at a first connection node; and a second arm connecting a second input node to the first common node, the second arm comprising a second capacitor characterized by the first capacitance and a second resistor characterized by the first resistance, the second capacitor and the second resistor connected in series at a second connection node; a first differential amplifier coupled to the RC network and configured to receive a filtered input signal from the AC-coupling network and generate an output signal, the first differential amplifier including: a differential pair of transistors including: a first transistor comprising a first gate connecting to the first arm at the first connection node; and a second transistor comprising a second gate connecting to the second arm at the second connection node; a common-mode measurement network, coupled to source terminals of the first and the second transistors, and configured to measure a common-mode voltage of the source terminals of the first and the second transistors; and a first operational amplifier coupled to the AC-coupling network and to the common-mode measurement network, the first operational amplifier configured to provide a feedback to the AC coupling network at the first common node such that the common-mode voltage of the source terminals of the first and second transistors of the differential pair of transistors tracks a reference voltage, the first operational amplifier including: a non-inverting input terminal configured to receive the reference voltage; an inverting input terminal connecting to a second common node of the common-mode measurement network; and an output terminal connecting to the first common node of the AC-coupling network.

Implementations may include one or more of the following features.

The common-mode measurement network may include: a third resistor connecting to a source terminal of the first transistor, the third resistor characterized by a second resistance; and a fourth resistor arranged in series with respect to the third resistor at the second common node, the fourth resistor connecting to a source terminal of the second transistor, the fourth resistor characterized by the second resistance.

The first arm and the second arm may be each operable as a high pass filter with a cut-off frequency determined by at least one of: the first capacitance and the first resistance.

The first operational amplifier may be configured to be driven by a difference between the reference voltage and the sensed common-mode voltage, and wherein the difference is amplified as the feedback asserted at the first common node.

The feedback may be capable of altering a first voltage at the first gate of the first transistor and a second voltage at the second gate of the second transistor such that the sensed common-mode voltage at the second common node of the equalizer becomes closer to the reference voltage than prior to said altering.

The receiver circuit may further include a reference-generating circuit that generates a reference voltage for the operational amplifier. The reference voltage generated by the reference-generating circuit may vary based on a supply voltage for the first differential amplifier. The reference voltage generated by the reference-generating circuit may vary based on the fabrication process of the receiver circuit. The reference voltage generated by the reference-generating circuit may vary based on the temperature of the receiver circuit.

The receiver circuit may further include a transistor network and a current source. The transistor network may include: a third transistor; and a fourth transistor, wherein a source terminal of the third transistor is connected to a drain terminal of the fourth transistor.

The reference voltage may be provided from where the source terminal of the third transistor is connected to the drain terminal of the fourth transistor. The transistor network may further include a fifth transistor, wherein a source terminal of the fourth transistor is connected to a drain terminal of the fifth transistor. A bias current flowing in the transistor network from a voltage supply may match bias currents flowing in the first differential amplifier.

The receiver circuit may further include: a fifth resistor located on the first arm, disposed between the first resistor and the first common node, arranged in series with respect to the first resistor at a third common node, and characterized by a third resistance; and a sixth resistor located on the second arm, disposed between the second resistor and the first common node, arranged in series with respect to the second resistor at a fourth common node, and characterized by a third resistance.

The receiver circuit may further include: an offset cancellation amplifier coupled to the AC-coupling network and the equalizer, the offset cancellation amplifier including: two output terminals respectively connected to the third common node and the fourth common node of the RC network, and two input terminals respectively coupled to two output terminals of the first differential amplifier.

The receiver circuit may further include a second differential amplifier that includes: a first input terminal and a second input terminal respectively connected to output terminals of the first differential amplifier. The receiver circuit may further include a third differential amplifier disposed between the second differential amplifier and the offset cancellation amplifier. The offset cancellation amplifier may be configured to reduce the offset voltage at the two output terminals of the second differential amplifier.

The offset cancellation amplifier may be configured to: sense the difference between the DC voltages at the two output terminals of the second differential amplifier; and amplify the difference to drive respective currents flowing from the third common node and the fourth common node of the RC network into the offset cancellation amplifier such that the difference between respective DC voltages at the two output terminals of the equalizer is reduced.

In another aspect, some implementations provide a receiver circuit that include: an alternate current (AC)-coupling network to filter an input signal, the AC-coupling network including a first RC filter connected between a first input node and a first common node and a second RC filter connected between a second input node and the first common node; a differential amplifier coupled to the AC-coupling network and configured to receive a filtered input signal from the AC-coupling network and generate an output signal, the differential amplifier comprising a differential pair of transistors and a common-mode measurement network coupled to source terminals of a first and a second transistors in the differential pair; and a first operational amplifier having an input coupled to output terminal of the common-mode measurement network and an output coupled to the first common node.

The details of one or more embodiments are set forth in the accompanying drawings and the description below. Other aspects, features, and advantages will become apparent from the description, the drawings, and the claims.

DESCRIPTION OF DRAWINGS

Like reference symbols in the various drawings indicate like elements.

DETAILED DESCRIPTION

The past decades have witnessed surging demands for high-speed wireline communication. While the increase of communication speed is an apparent impetus behind the surging demands, other salient features such as the flexibility of the wireline communication devices are becoming increasingly prevalent in next-generation devices. In many circumstances, transmitters and receivers that are adaptable in a variety of situations are becoming increasingly desirable. The applications of high-speed wireline communication include short-range communications such as memory links for mobile devices, medium range transmissions such as Ethernet links or Internet of Things (IoT) networks, and long range transmissions such as cable TV and Internet links.

High-speed wireline link system can employ specialized Input/Output (I/O) circuitry that performs incident wave signaling over channels with controlled-impedance to achieve high data rates. In these systems, the channel's frequency-dependent dispersion characteristics and impedance discontinuities can hinder data rate scaling.

This specification describes methodologies to isolate common-mode signals, in particular, common-mode voltages between a transmitter (used interchangeably with TX) device and a receiver (used interchangeably with RX) device on a high-speed wireline link device. The methodologies utilize on-chip AC-coupling networks placed in series to the signal transition channel that acts as a high frequency signal pass filter while reducing baseline wander during the data signal transition. By incorporating an operational amplifier in the RX device as a feedback to the AC-coupling network, the RX device can use larger resistors in the RC networks while mitigating large voltage drop in the AC-coupling network.

More particularly, an RX device can include a feedback loop from the equalizer to the AC-coupling network. The feedback loop includes an operational amplifier. The feedback loop may adjust the input common-mode voltage of the equalizer to track a reference voltage of the operational amplifier. Further, a reference-generating circuit can be incorporated on the RX chip, to generate a reference voltage for the operational amplifier. Additionally, an offset cancellation amplifier can be combined with the RX device, to cancel the offset voltage at the output of the equalizer. The offset cancellation amplifier senses the offset voltage at the output of the equalizer and sinks various currents in the AC-coupling network. Implementations can adjust the output DC offset of equalizer circuit to be substantially zero by tuning the currents in the AC-coupling network via the offset cancellation amplifier.

Figure 1:
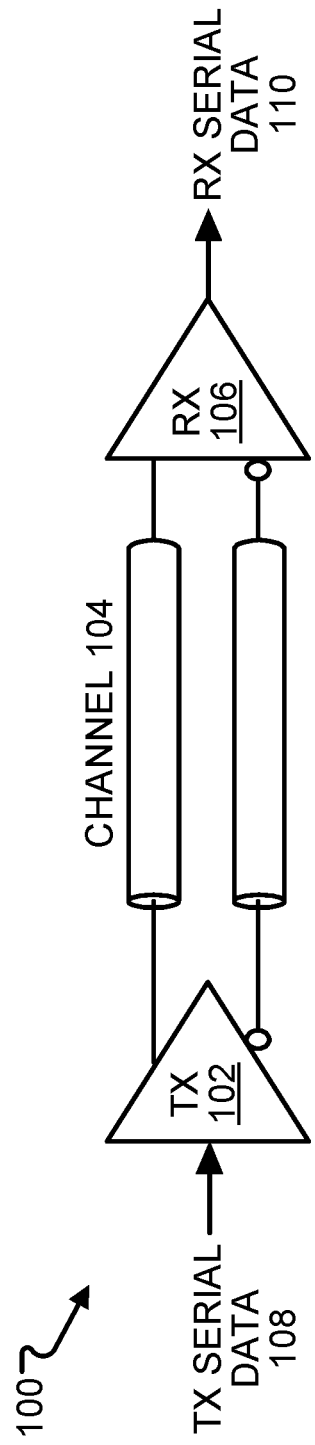
FIG. 1 shows an example of a high-speed wireline link device.

FIG. 1 shows an example of a high-speed wireline link system 100. The high-speed wireline link system 100 includes a transmitter 102, a channel 104, and a receiver 106. In this example, the transmitter 102 may receive and process input serial data 108. The transmitter 102 is connected to one end of the channel 104 and provides the processed serial data signal to the channel 104. In some examples, due to the limited number of high-speed I/O pins in chip packages and printed circuit board (PCB) wiring constraints, the transmitter 102 with high-bandwidth may serialize input data in parallel form for transmission. The transmitter 102 may generate a voltage swing on the channel 104 while also maintaining a consistent output impedance in order to attenuate channel-induced reflections. The channel 104 can be a differential channel.

The receiver 106 is connected to the other end of the channel 104 and receives a transmitted signal data from the channel 104. The receiver 106 processes the data and outputs RX serial data 110. In the example of serialized data, RX serial data 110 may be sampled and de-serialized. In this illustration, the receiver 106 may compare the incoming data signal to a threshold and amplify the signal to a complementary metal-oxide-semiconductor (CMOS) value.

In this illustration, the transmitter 102 and the receiver 106 are located on two different integrated circuits (ICs). The channel 104 is a medium, in which the serial electrical signal travels from the transmitter 102 to the receiver 106. The channel 104 accommodates propagation of a complementary signal. In this example, the channel 104 can be a cable, a stripe line or a microstrip over a PCB, or a combination of these.

In this example, the communication bandwidth of the channel 104 is limited by a number of factors, including, for example, high-frequency loss of electrical traces, reflections caused from impedance discontinuities, and signal crosstalk in the channel 104. The relative magnitudes of impedance of the channel 104 may depend on the length and the quality factor Q of the channel 104 which, in turn, are functions of the underlying applications. The frequency dependent loss terms result in low-pass channels where the attenuation increases with the distance. The high-frequency content of an input signal sent across such channel is filtered out, giving rise to an output signal whose energy has been spread or dispersed over several bit periods. In this example, the channel 104 may exhibit minor attenuation in DC and low-frequency regions relative to high-frequency regions for signal transmission, which causes that the common-mode voltage of the transmitter 102 and the receiver 106 to be almost the same. The DC coupling between the transmitter 102 and the receiver 106 can complicate the device design. Decoupling the common-mode voltages of the transmitter 102 from that of the receiver 106 may allow a judiciously chosen common-mode voltage to be used for each circuit. More discussions on the demarcation between low frequency and high frequency regions as well as the judicious choice for the common voltage are provided below.

Some implementations may isolate the common-mode voltages of the transmitter 102 and receiver 106 by using AC-coupling capacitors placed in the transmitter 102 or the receiver 106, and in series with the channel 104 to act as a high-pass filter. The AC-coupling capacitors are used to block the DC component of the waveform so that the circuit downstream can operate in the absence of the DC component. However, such AC-coupled links can be susceptible to a phenomenon known as baseline wander, in which the AC-coupling network filters out some of the signal energy that is below the cut-off frequency of the AC-coupling network. In this example, the high-pass filtering characteristic of the AC-coupling network causes the middle of the data eye to wander with low frequency components in the Non-Return-to-Zero (NRZ) data stream. This phenomena causes the received data eye height and eye width to reduce or become totally closed.

To mitigate baseline wandering, the value of the AC-coupling capacitors may be increased to reduce the cutoff frequency of an AC-coupling network. In some examples, a 100-nF capacitor may be used in the peripheral component interconnect (PCI) express standard. An example of such a capacitor, placed in series with a channel that has a characteristic impedance of 50Ω, could result in a time-constant of 10 µs, or a high-pass cutoff frequency of about 16 kHz.

When the AC-coupling capacitors are placed on a PCB, vertical interconnect access (VIA) may be introduced on the PCB when connecting the AC-coupling capacitors placed on the PCB board to the data transmission lines, which are normally realized as differential strip line. These VIAs cause unwanted impedance discontinuities, which degrade the signal integrity by introducing dispersion and reflections. To reduce the inter-symbol interference (ISI) due to impedance discontinuity caused by VIAs, the receiver 106 may incorporate a decision feedback equalizer (DFE) with multiple taps, which increases the overall power consumption and device area of the receiver 106. Some implementations may address the issues regarding the on-board AC-coupling capacitors by putting the AC-coupling capacitors on the receiver 106. These implementations may reduce the component cost and board area. Furthermore, large computing/networking systems with multiple I/Os can benefit from the absence of on-board capacitors.

Figure 2:
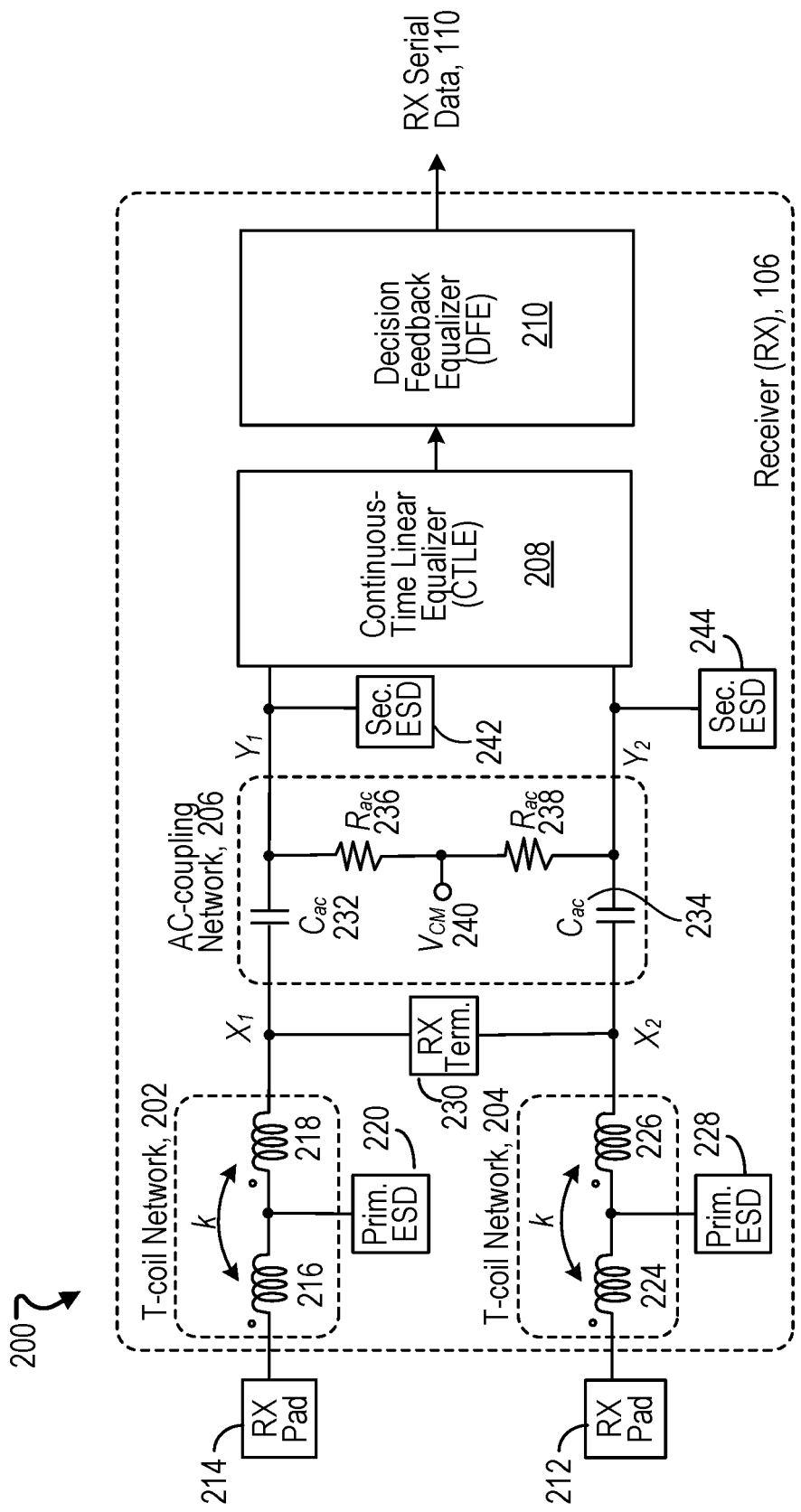
FIG. 2 shows an example of a wireline receiver device that incorporates an on-chip AC-coupling network.

FIG. 2 shows an example of a wireline receiver device 200 that incorporates an on-chip AC-coupling network 206. The receiver 106 includes a pair of T-coil networks 202 and 204, an AC-coupling network 206, a continuous-time linear equalizer (CTLE) 208, and a decision feedback equalizer (DFE) 210. In this example, the electrical signals are transmitted from the channel 104 to the receiver 106 through the RX pads 214 and 212. For example, the RX pad 214 can be coupled to the (+) signal wire of the channel 104 and the RX pad 212 can be coupled to the (−) signal wire of the channel 104. The processed electrical signals are output from the receiver 106 as serial data to the downstream devices.

In the receiver 106, the input serial data 108 first propagates through the T-coil network 202 and T-coil network 204. The T-coil network 202 includes two mutual inductors 216 and 218 connected in series between the RX pad 214 and a node $X_1$. Similarly, the T-coil network 204 includes two mutual inductors 224 and 226 connected in series between the RX pad 212 and a node $X_2$. In both T-coil networks, the inductors can be configured for improving impedance matching and reducing the input return-loss. In addition, the T-coil network 202 is coupled with an electrostatic discharge (ESD) protection circuit 220. The ESD protection circuit 220 is physically located between the inductor 216 and inductor 218. The T-coil network 204 is likewise coupled to ESD protection circuit 228, which is located between inductors 224 and 226. A resistive termination network (RX terminal or Term.) 230 is connected to T-coil network 202 and T-coil network 204, and coupled between the nodes $X_1$ and $X_2$ to match the input impedance of the receiver 106 with the characteristic impedance of the channel 104.

In this example, the AC-coupling network 206 couples to the RX terminal at the two nodes $X_1$ and $X_2$. The AC-coupling network 206 includes two RC network arms arranged in series and connected at a common node 240. The first RC network arm includes a capacitor $C_{ac}$ 232 and a resistor $R_{ac}$ 236. The capacitor $C_{ac}$ 232 is connected to the first node $X_1$, and connects to the resistor $R_{ac}$ 236 at a connection node $Y_1$. The configuration of the second RC network arm is similar to that of the first RC network arm, and includes a capacitor $C_{ac}$ 234 and a resistor $R_{ac}$ 238. The capacitor $C_{ac}$ 234 is connected to the second node $X_2$, and connects to the resistor $R_{ac}$ 238 at a connection node $Y_2$. The combination of $C_{ac}$ and $R_{ac}$ in the RC network arms generates a high-pass filter with a high-pass cut-off frequency of $f_{HP}$. In this example, the high-pass cut-off frequency is given by:

$$f_{HP} = \frac{1}{2\pi R_{ac} C_{ac}} \quad (1)$$

In some examples, the value of the largest capacitors that can be configured on the receiver 106 is usually limited to a few pF. For example, if the receiver 106 is designed to have $C_{ac}$=4 pF and $f_{HP}$=50 kHz, the value of $R_{ac}$ in the AC-coupling network 206 can be about 800 kΩ.

In this example, the wireline receiver device 200 includes secondary ESD protection circuits 242 and 244. The secondary ESD protection circuits 242 and 244 respectively connect to the connection nodes $Y_1$ and $Y_2$.

The receiver 106 includes the CTLE 208 that receives input signal data from the AC-coupling network 206 and sends processed data signal to the DFE 210. In this example, the CTLE 208 may be part of the front-end of the receiver 106. In some examples, the CTLE 208 may compensate for high frequency channel loss.

The receiver 106 also includes the DFE 210 that receives input signal data from CTLE 208 and generates the processed serial data 110 as output of receiver 106. In a high-speed wireline communication system, due to the skin effect and dielectric losses, the channels often introduce large ISI that can lead to errors on the receiver side. To deal with the ISI, an equalization circuit such as, for example, DFEs can be adopted to restore the transmitted data signals on the receiver side to maintain the Bit Error Rate (BER) below a targeted level. In this example, the DFE 210 may learn from previously recovered data signals to adaptively estimate a distortion on the current data signal, and then subtract the estimated distortion value from the received data signal. For example, in multi Gigabit per second (e.g., 40 Gb/s to 100 Gb/s) links, the DFE 210 may reduce the post-cursor ISI for channels with a long impulse response tail. In some other examples, the receiver 106 system is sensitive to input noise and crosstalk, and may include a higher complexity DFE circuit, in order to more extensively compensate for the total channel loss. The DFE 210 may use quantized input values to control the polarity of the equalization taps to reduce the noise build-up in the receiver 106.

Figure 3:
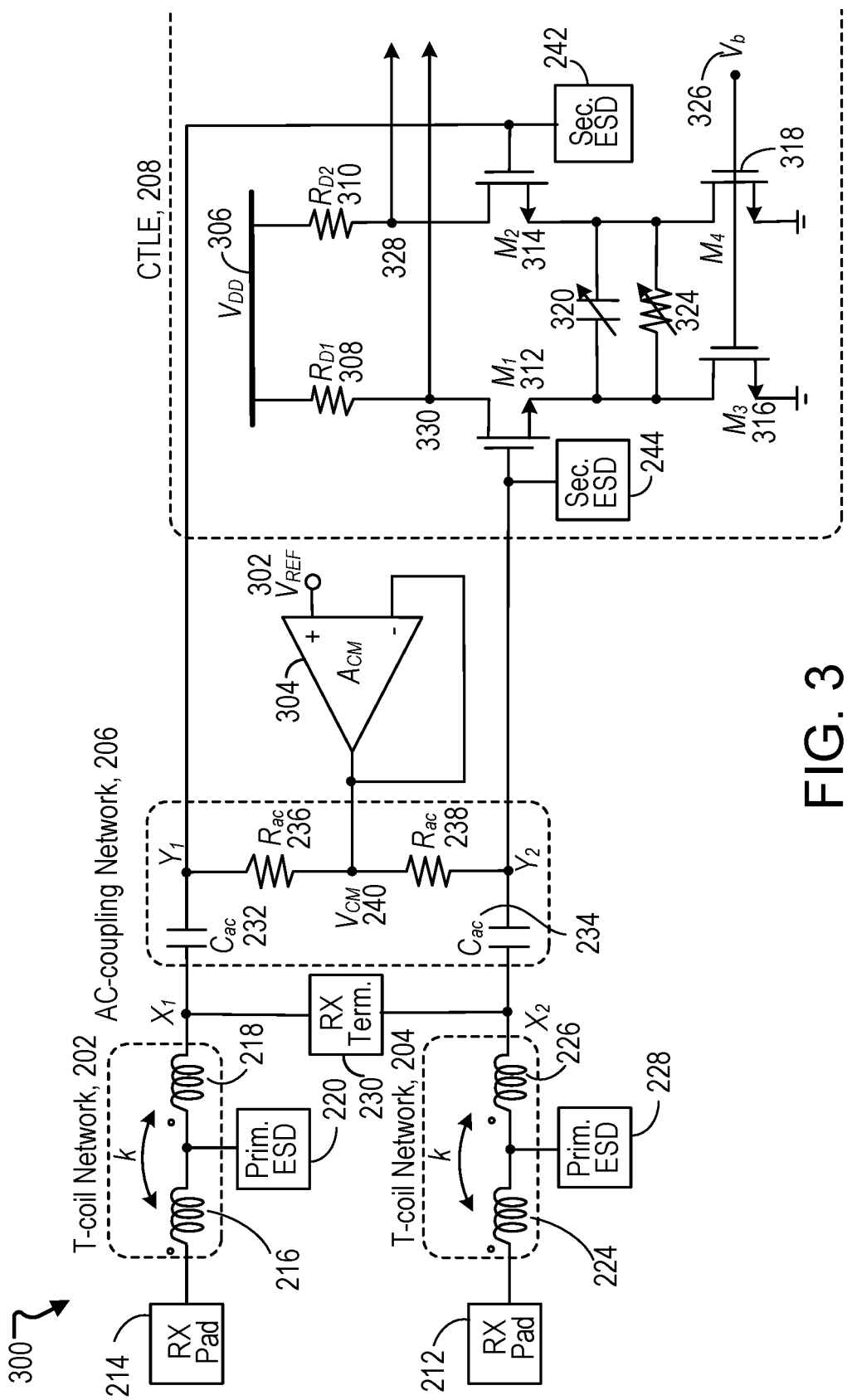
FIG. 3 shows an example of a wireline receiver device with a common-mode voltage $V_{CM}$ generated by an operational amplifier $A_{cm}$.

FIG. 3 shows an example of a receiver device 300 with a common-mode voltage $V_{CM}$ generated by an operational amplifier $A_{CM}$. The wireline receiver device 300 includes a pair of T-coil networks 202 and 204, an AC-coupling network 206, an operational amplifier $A_{CM}$ 304, and a CTLE 208. The wireline receiver device 300 can be similar to the wireline receiver device 200, except as described below.

In the wireline receiver device 300, the operational amplifier $A_{CM}$ 304 has an output feeding into the AC-coupling network 206 at the common node 240. In this example, the operational amplifier $A_{CM}$ 304 includes a non-inverting input terminal at node 302 that receives the reference voltage $V_{REF}$. The operational amplifier $A_{CM}$ 304 also includes an inverting input terminal and an output terminal that both connected to the common node 240 in the AC-coupling network 206. In some examples, the reference voltage $V_{REF}$ is set to a desired input common-mode voltage for the receiver 106. The desired input common-mode voltage $V_{CM}$ may depend on the design of the receiver 106 in use, and may be selected in order to induce the receiver 106 to operate in desired regions. For example, the desired regions can be a region in which all the CTLE transistors, including $M_1$, $M_2$, $M_3$ and $M_4$, operate in their saturation region (and away from the triode region) with adequate gain and noise rejection characteristics as well as desired common mode rejection characteristics.

The CTLE 208 receives the filtered input data signal from the AC-coupling network 206, and generates an output data signal at output terminals 328 and 330. The CTLE 208 includes a transistor $M_1$ 312 and a transistor $M_2$ 314 matched to $M_1$ 312. During the fabrication of integrated devices on wafers, each device undergoes slightly different fabrication process. In addition, different wafers experience different fabrication processes. For illustration, for two resistors with 1-kΩ resistance on a single integrated circuit, the value of these two resistors could increase or decrease because of variations in the fabrication process. The scale of increase or decrease could also vary. But if the two resistors have the same width and the same length and are fabricated beside each other on the wafer, the two resistors experience almost the same amount of process variation, and as such the resistance values scale up or down by almost the same factor. These two resistors are then called matched resistors. Matched devices do not necessary have the same values, but matched devices are made of unit cells with the same geometries and are placed close to each other and with the same orientation. For example, a current source with 2 μA of current could be matched with a current source with 10 μA of current. In this illustration, if the current of the first current source increases by 10%, the current of the second current source increases by almost the same amount of 10%. The transistor $M_1$ 312 includes a gate connected to the connection node $Y_2$ in the second RC network arm, and the transistor $M_2$ 314 includes a gate connected to the connection node $Y_1$ in the first RC network arm. In this example, the CTLE 208 also includes resistors 308 and 310 respectively connected to the drain terminals of the transistor $M_1$ 312 and transistor $M_2$ 314. The other ends of the resistors 308 and 310 are connected to line 306 to receive a supply voltage $V_{DD}$. The CTLE 208 also includes a transistor $M_3$ 316 and a transistor $M_4$ 318. The drain terminals of the transistor $M_3$ 316 and transistor $M_4$ 318 are respectively connected to the source terminals of the transistor $M_1$ 312 and transistor $M_2$ 314. The gate terminals of the transistor $M_3$ 316 and transistor $M_4$ 318 are both connected to a voltage node $V_b$ 326. The source terminals of the transistor $M_3$ 316 and the transistor $M_4$ 318 are connected to the ground. The drain terminals of the transistor $M_3$ 316 and the transistor $M_4$ 318 are connected by a capacitor 320 and a resistor 324. Both the capacitor 320 and the resistor 324 can be adjustable. The capacitor 320 and the resistor 324 are arranged in parallel.

In this example, a desired input common-mode voltage $V_{CM,des}$ is given by:

$$V_{CM,des} = V_{GS1} + V_{dsat3} + V_{margin} \quad (2)$$

Here, the $V_{GS1}$ is the bias gate-source voltage of transistors $M_1$ 312 and $M_2$ 314; $V_{dsat3}$ can be the minimum drain-source voltage that keeps transistors $M_3$ 316 and $M_4$ 318 in saturation; and $V_{margin}$ is a voltage margin that accommodates sufficient signal swing at the drain nodes of transistors $M_3$ 316 and $M_4$ 318 before transistors $M_3$ 316 and $M_4$ 318 degenerate into operating in triode region.

The gate terminal of MOSFET can leak considerable current in some fabrication processes. In some examples, e.g., in the configuration shown in FIG. 3, the gate leakage of transistors $M_1$ 312 and $M_2$ 314 and the leakage current in the secondary ESD protection circuits 242 and 244 can become considerable to cause a substantial voltage drop across resistors $R_{ac}$ 236 or 238. In semiconductor manufacturing, a process corner is an example of a design-of-experiments (DoE) technique that refers to a variation of fabrication parameters used in applying an integrated circuit design to a semiconductor wafer. Process corners represent the extremes of these parameter variations within which a circuit that has been etched onto the wafer must function correctly. A conventional name for process corner uses two-letter designators, where the first letter refers to the variation of the N-channel MOSFET (NMOS) transistors, and the second letter refers to the variations of the P channel (PMOS) transistors. There are five possible corners: typical-typical (TT) (not really a corner of an n vs. p mobility graph, but called a corner, anyway), fast-fast (FF), slow-slow (SS), fast-slow (FS), and slow-fast (SF). In the configuration shown in FIG. 3, at fast-fast and high temperature corners and when resistors $R_{ac}$ 236 or 238 have large values, the voltage drop can be on the order of 100 mV. Although smaller values $R_{ac}$ resistors can be used and additional baseline wander correction circuits can be incorporated, such correction measures introduce additional complexity to the design of the circuit.

Figure 4:
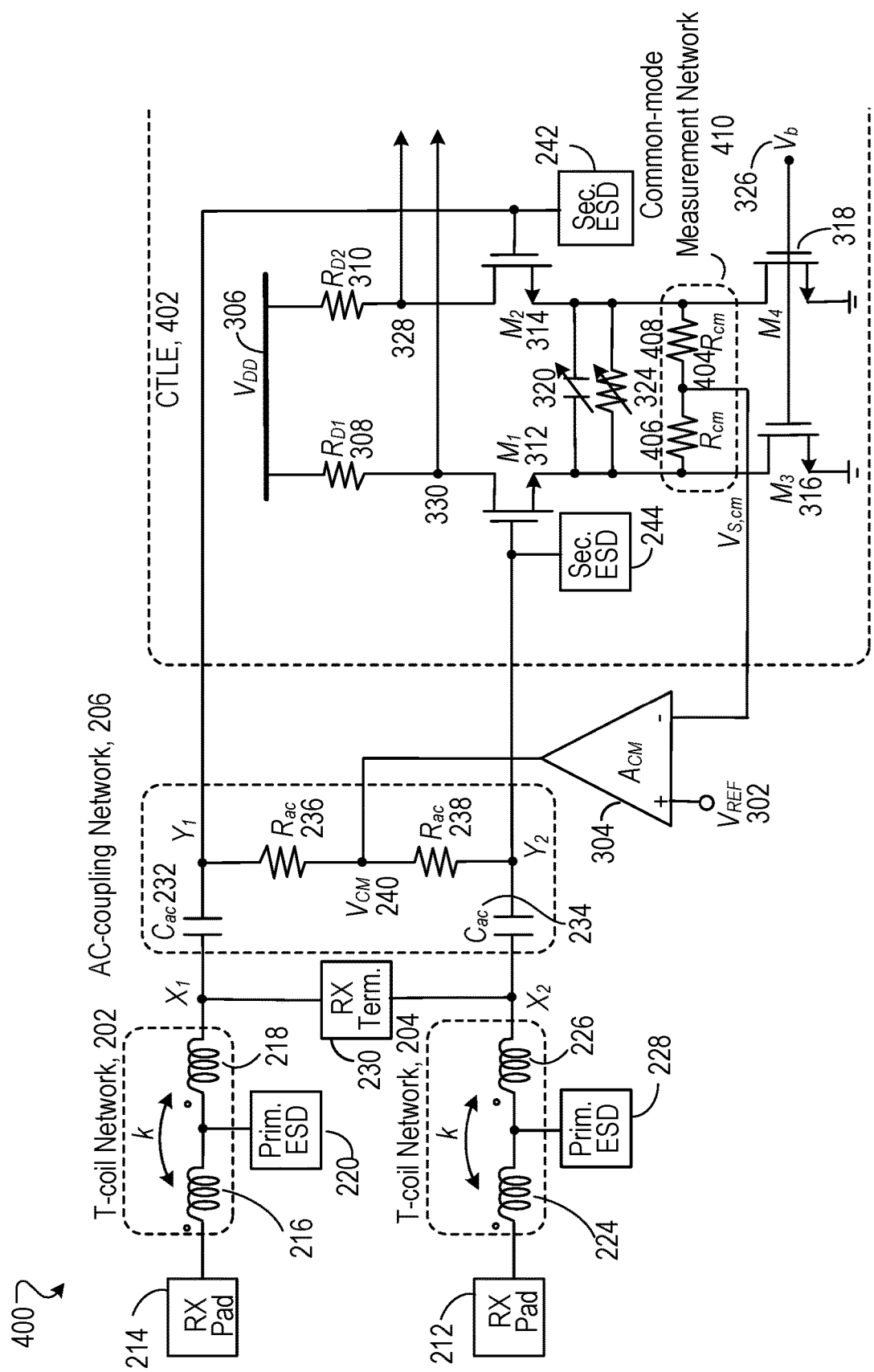
FIG. 4 shows an example of a wireline receiver device that incorporates large-resistance $R_{ac}$ resistors while mitigating large voltage drop across the $R_{ac}$ resistors.

FIG. 4 shows an example of a receiver device 400 that incorporates large-resistance $R_{ac}$ resistors while mitigating large voltage drop across the $R_{ac}$ resistors. The wireline receiver device 400 can be similar to the wireline receiver device 300, except as described below. In this example, the receiver 400 includes a pair of T-coil networks 202 and 204, an AC-coupling network 206, an operational amplifier $A_{CM}$ 304, and a CTLE 402.

The CTLE 402 includes a common-mode measurement network 410 coupled to the source terminals of the transistor $M_1$ 312 and the transistor $M_2$ 314. The common-mode measurement network 410 measures the common-mode voltage of the source terminals of transistor $M_1$ 312 and transistor $M_2$ 314. The common-mode measurement network 410 may include a pair of coupled resistors $R_{cm}$ 406 and 408 connected at a common node 404. The voltage at the common node 404 is referred to as $V_{S,CM}$. The resistors $R_{cm}$ 406 and $R_{cm}$ 408 are characterized by a substantially identical resistance. The resistor $R_{cm}$ 406 is connected to the source terminal of the transistor $M_1$ 312; and the resistor $R_{cm}$ 408 is connected to the source terminal of the transistor $M_2$ 314. The operational amplifier $A_{CM}$ 304 includes a non-inverting input terminal that receives a reference voltage $V_{REF}$ at node 302, and an inverting input terminal connected to the common node $V_{S,CM}$ 404 in the CTLE 402. An output terminal of the operational amplifier $A_{CM}$ 304 is connected to the common node 240 in the AC-coupling network 206.

In the receiver 400, a feedback loop is formed and includes resistors $R_{cm}$ 406 and 408, the operational amplifier $A_{CM}$ 304, resistors $R_{ac}$ 236 and 238, and transistors $M_1$ 312 and $M_2$ 314. This feedback loop can adjust the input common-mode voltage of the CTLE 402 such that the drain voltage of $M_3$ 316 and $M_4$ 318 are maintained at a desired value that tracks the reference voltage $V_{REF}$ at node 302. In some examples, when the voltage drop across resistors $R_{ac}$ 236 and 238 become a few tens or hundreds of millivolts due to the leakage currents, a drop of the gate voltages of $M_1$ 312 and $M_2$ 314 follows. This further causes a drop in the drain voltages of transistors $M_3$ 316 and $M_4$ 318. If the voltage drop across resistors $R_{ac}$ 236 and 238 is not compensated, the transistors $M_3$ 316 and $M_4$ 318 may degenerate into operating in the triode region while the data signals at the sources terminals of transistors $M_1$ 312 and $M_2$ 314 swing up and down. However, in the example shown in FIG. 4, the common-mode voltage $V_{S,cm}$ at the source terminals of $M_1$ 312 and $M_2$ 314, is sensed through resistors $R_{cm}$ 406 and 408, and is then compared with reference voltage $V_{REF}$ at node 302 through the operational amplifier $A_{CM}$ 304. The operational amplifier $A_{CM}$ 304 adjusts its output voltage such that $V_{S,cm}$ 404 remains substantially close to reference voltage $V_{REF}$ at node 302.

Figure 5:
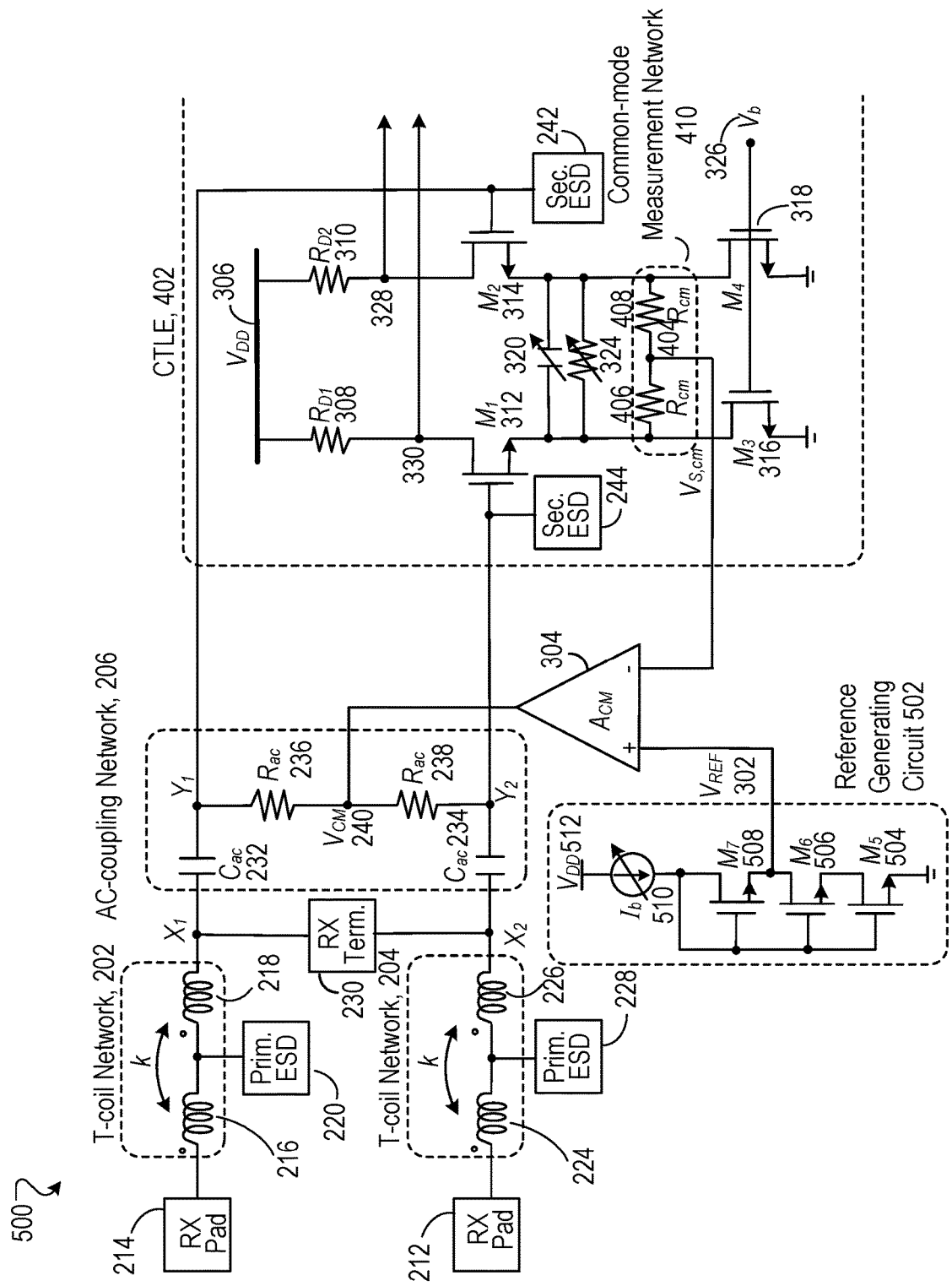
FIG. 5 shows an example of a wireline receiver device including a continuous-time linear equalizer, for which a reference voltage is generated using a reference-generating circuit to substantially track process and temperature variations.

Implementations can generate the reference voltage for the input common-mode feedback in the receiver circuit. FIG. 5 shows an example of a receiver device 500 that uses a reference-generating circuit whose output voltage can vary according to the variations in temperature and fabrication process. In other words, if the fabrication process changes or the temperature of circuit changes, the common-mode feedback loop keeps $M_3$ and $M_4$ in the saturation region and away from their triode region. The wireline receiver device 500 can be similar to the wireline receiver device 400, except as described below. In this example, the receiver 500 includes a pair of T-coil networks 202 and 204, an AC-coupling network 206, an operational amplifier $A_{CM}$ 304, a CTLE 402 and a reference-generating circuit 502.

In this example, the reference-generating circuit 502 includes transistors $M_5$ 504, $M_6$ 506 and $M_7$ 508 matched with transistors $M_3$ 316 and $M_4$ 318 in the CTLE 402, and the bias current source $I_b$ 510 matched with the bias currents of transistors $M_3$ 316 and $M_4$ 318. The transistors $M_5$ 504, $M_6$ 506 and $M_7$ 508 are connected in series, and the gates of these transistors are connected to the supply voltage $V_{DD}$ 512 through the bias current source $I_b$ 510. The source terminal of the transistor $M_7$ 508 is connected to the drain terminal of the transistor $M_6$ 506; the source terminal of the transistor $M_6$ 506 is connected to the drain terminal of the transistor $M_5$ 504; and the source terminal of transistor $M_5$ 504 is connected to the ground. The reference voltage $V_{REF}$ at node 302 is provided from the common node where the source terminal of transistor $M_7$ 508 is connected to the drain terminal of transistor $M_6$ 506.

The bias current $I_b$ and the number of stacked devices are adjusted such that:

$$V_{REF}=V_{dsat3}+V_{margin} \qquad (3)$$

In the circuit shown in FIG. 5, the bias current $I_b$ should be matched with the bias currents that flows in transistors $M_3$ and $M_4$.

Figure 6:
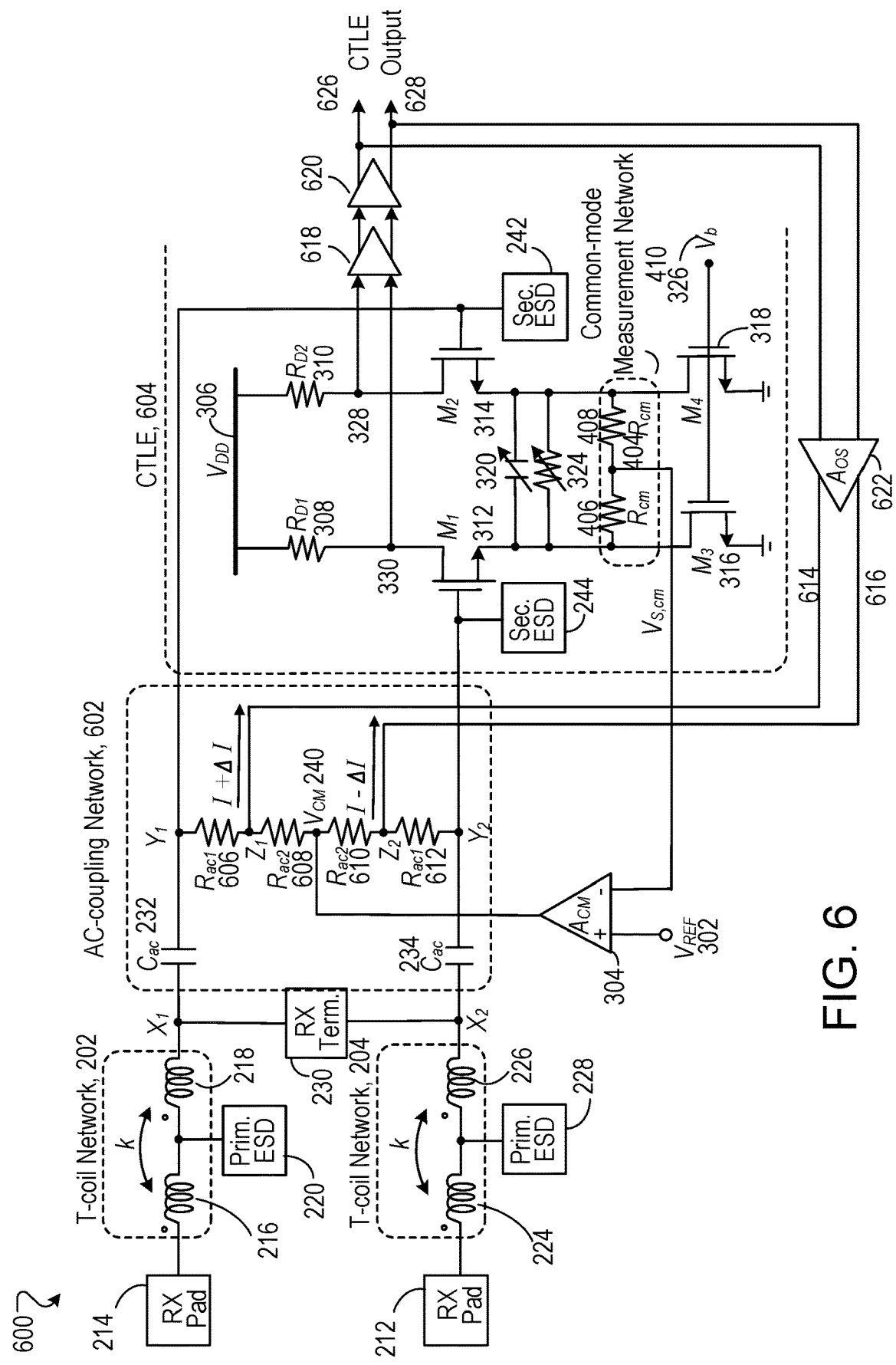
FIG. 6 shows an example of a wireline receiver device combined with offset cancellation amplifiers.

One of the advantages of the input common-mode feedback circuit disclosed in this specification is that this feedback circuit can be combined with an offset cancellation amplifier, to substantially reduce the offset voltage at the output of the CTLE or a given stage of the CTLE. FIG. 6 shows an example of a receiver device 600 combined with an offset cancellation amplifier. The wireline receiver device 600 can be similar to the wireline receiver device 400, except as described below. In this example, the receiver 600 includes a pair of T-coil networks 202 and 204, an AC-coupling network 602, an operational amplifier $A_{CM}$ 304, a CTLE 604 and an offset cancellation amplifier 622. In addition, although not illustrated in FIG. 6, the receiver device 600 can include the reference-generating circuit 502.

In the AC-coupling network 602, the first RC network includes two resistors $R_{ac1}$ 608 and $R_{ac2}$ 606 arranged in series and connected at a common node $Z_1$. Similarly, the second RC network also includes two resistors $R_{ac1}$ 610 and $R_{ac2}$ 612 arranged in series and connected at a common node $Z_2$. The resistance of $R_{ac1}$ and $R_{ac2}$ can be substantially different. The receiver 600 may include two cascaded amplifiers 618 and 620, and the input terminals of the first amplifier 618 are respectively connected to the drain terminals of the transistors $M_1$ 312 and $M_2$ 314. The output terminals of the second amplifier 620 are connected to the inputs of the offset cancellation amplifier 622. The offset cancellation amplifier 622 is coupled to the AC-coupling network 602; two output terminals 614 and 616 of the offset cancellation amplifier 622 are respectively connected to nodes $Z_1$ and $Z_2$ in the RC networks.

In this example, the offset cancellation amplifier 622 can reduce the DC offset voltage at the two output terminals 626 and 628 of the equalizer. Furthermore, the offset cancellation amplifier 622 may sense the difference between the respective voltages at the two output terminals 626 and 628 of the CTLE 604, and then sink or source two different currents I+ΔI and I−ΔI respectively from nodes $Z_1$ and $Z_2$ to terminals 614 and 616. The difference between the sunk or sourced currents from common nodes $Z_1$ and $Z_2$ are proportional to the offset voltage at the output terminals 626 and 628 of the CTLE 604. In this example, the offset cancellation loop adjusts the values of the sunk currents such that the offset voltage at the output terminals of the CTLE 604 becomes substantially zero.

What has been described is a method for isolating common-mode voltages between a transmitter device and a receiver device on a high-speed wireline link device on a high-speed wireline link device. Although the example of an operational amplifier is advantageously employed as a feedback component on any receiver device, the advantages of the specification are best exploited within high speed wireline link devices. Indeed, a number of implementations have been described. Nevertheless, it will be understood that various modifications can be made without departing from the spirit and scope of the subject innovation. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A receiver circuit, comprising:
an alternate current (AC)-coupling network to filter an input signal, the AC-coupling network including a first RC filter connected between a first input node and a first common node and a second RC filter connected between a second input node and the first common node;
a differential amplifier coupled to the AC-coupling network and configured to receive a filtered input signal from the AC-coupling network and generate an output signal, the differential amplifier comprising a differential pair of transistors and a common-mode measurement network coupled to source terminals of a first and a second transistors in the differential pair; and
a first operational amplifier having an input coupled to output terminal of the common-mode measurement network and an output coupled to the first common node.

2. A receiver circuit, comprising:
an alternate current (AC)-coupling network coupled to two input nodes, the AC-coupling network configured to filter an input signal and including:
a resistor-capacitor (RC) network coupled to the two input nodes, the RC network including:
a first arm connecting a first input node to a first common node, the first arm comprising a first capacitor characterized by a first capacitance and a first resistor characterized by a first resistance, the first capacitor and the first resistor connected in series at a first connection node; and
a second arm connecting a second input node to the first common node, the second arm comprising a second capacitor characterized by the first capacitance and a second resistor characterized by the first resistance, the second capacitor and the second resistor connected in series at a second connection node;
a first differential amplifier coupled to the RC network and configured to receive a filtered input signal from the AC-coupling network and generate an output signal, the first differential amplifier including:
a differential pair of transistors including:
a first transistor comprising a first gate connecting to the first arm at the first connection node; and
a second transistor comprising a second gate connecting to the second arm at the second connection node;
a common-mode measurement network, coupled to source terminals of the first and the second transistors, and configured to measure a common-mode voltage of the source terminals of the first and the second transistors; and
a first operational amplifier coupled to the AC-coupling network and to the common-mode measurement network, the first operational amplifier configured to provide a feedback to the AC-coupling network at the first common node such that the common-mode voltage of the source terminals of the first and second transistors of the differential pair of transistors tracks a reference voltage, the first operational amplifier comprising:
a non-inverting input terminal configured to receive the reference voltage;
an inverting input terminal connecting to a second common node of the common-mode measurement network; and
an output terminal connecting to the first common node of the AC-coupling network.

3. The receiver circuit of claim 2, wherein the common-mode measurement network comprises:
a third resistor connecting to a source terminal of the first transistor, the third resistor characterized by a second resistance; and
a fourth resistor arranged in series with respect to the third resistor at the second common node, the fourth resistor connecting to a source terminal of the second transistor, the fourth resistor characterized by the second resistance.

4. The receiver circuit of claim 2, wherein the first arm and the second arm are each operable as a high pass filter with a cut-off frequency determined by at least one of: the first capacitance, or the first resistance.

5. The receiver circuit of claim 2, wherein the first operational amplifier is configured to be driven by a difference between the reference voltage and the common-mode voltage, and wherein the difference is amplified to provide the feedback to the first common node.

6. The receiver circuit of claim 5, wherein the feedback is capable of altering a first voltage at the first gate of the first transistor and a second voltage at the second gate of the second transistor such that the common-mode voltage at the second common node of the common-mode measurement network becomes closer to the reference voltage than prior to said altering.

7. The receiver circuit of claim 2, further comprising a reference-generating circuit that generates the reference voltage for the operational amplifier.

8. The receiver circuit of claim 7, where the reference voltage generated by the reference-generating circuit is variable based on a supply voltage for the first differential amplifier.

9. The receiver circuit of claim 7, where the reference voltage generated by the reference-generating circuit is variable based on a fabrication process of the receiver circuit.

10. The receiver circuit of claim 7, where the reference voltage generated by the reference-generating circuit is variable based on a temperature of the receiver circuit.

11. The receiver circuit of claim 7, wherein the reference-generating circuit includes a current source and a transistor network, the transistor network comprising:
a third transistor; and a fourth transistor, wherein a source terminal of the third transistor is connected to a drain terminal of the fourth transistor and gate terminals of the third and fourth transistors are connected together and also to the current source.

12. The receiver circuit of claim 11, wherein the reference voltage is provided from where the source terminal of the third transistor is connected to the drain terminal of the fourth transistor.

13. The receiver circuit of claim 11, wherein the transistor network further comprises:

a fifth transistor, wherein a source terminal of the fourth transistor is connected to a drain terminal of the fifth transistor and the gate terminal of the fifth transistor is connected to the gate terminal of the fourth transistor.

14. The receiver circuit of claim 11, wherein a bias current flowing in the transistor network from a voltage supply matches bias currents flowing in the first differential amplifier.

15. The receiver circuit of claim 2, further comprising:
a fifth resistor located on the first arm, disposed between the first resistor and the first common node, arranged in series with respect to the first resistor at a third common node, and characterized by a third resistance; and
a sixth resistor located on the second arm, disposed between the second resistor and the first common node, arranged in series with respect to the second resistor at a fourth common node, and characterized by a third resistance.

16. The receiver circuit of claim 15, further comprising:
an offset cancellation amplifier coupled to the AC-coupling network and the first differential amplifier, the offset cancellation amplifier comprising:
two output terminals respectively connected to the third common node and the fourth common node of the RC network, and
two input terminals respectively coupled to two output terminals of the first differential amplifier.

17. The receiver circuit of claim 16, further comprising a second differential amplifier that includes:
a first input terminal and a second input terminal respectively connected to the two output terminals of the first differential amplifier.

18. The receiver circuit of claim 17, further comprising:
a third differential amplifier that includes: a first input terminal and a second input terminal respectively connected to output terminals of the second differential amplifier.

19. The receiver circuit of claim 18, wherein at least one of: the first differential amplifier, the second differential amplifier, or the third differential amplifier, is an active equalizer.

20. The receiver circuit of claim 16, wherein the offset cancellation amplifier is configured to:
sense the difference between respective DC voltages at the two output terminals of the first differential amplifier; and
amplify the difference to drive respective currents flowing from the output terminals of the offset cancellation amplifier to the third common node and the fourth common node of the RC network such that the difference between respective DC voltages at the two output terminals of the first differential amplifier is reduced.

* * * * *